(12) United States Patent
Richter et al.

(10) Patent No.: US 8,658,509 B2
(45) Date of Patent: Feb. 25, 2014

(54) SEMICONDUCTOR RESISTORS FORMED AT A LOWER HEIGHT LEVEL IN A SEMICONDUCTOR DEVICE COMPRISING METAL GATES

(75) Inventors: Ralf Richter, Dresden (DE); Jens Heinrich, Wachau (DE); Andy Wei, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 521 days.

(21) Appl. No.: 12/907,731

(22) Filed: Oct. 19, 2010

(65) Prior Publication Data
US 2011/0156162 A1    Jun. 30, 2011

(30) Foreign Application Priority Data
Dec. 31, 2009   (DE) .................. 10 2009 055 437

(51) Int. Cl.
*H01L 21/20*   (2006.01)
*H01L 27/06*   (2006.01)

(52) U.S. Cl.
USPC ................ 438/382; 257/381; 257/E27.016; 438/238

(58) Field of Classification Search
USPC ................................ 438/238, 382
See application file for complete search history.

(56) References Cited

U.S. PATENT DOCUMENTS

| | | | |
|---|---|---|---|
| 2006/0024893 A1 | 2/2006 | Min et al. | 438/287 |
| 2009/0236669 A1* | 9/2009 | Chen et al. | 257/380 |
| 2009/0258482 A1 | 10/2009 | Lin et al. | 438/585 |
| 2010/0320544 A1* | 12/2010 | Tseng et al. | 257/380 |

OTHER PUBLICATIONS

Translation of Official Communication from German Patent Office for German Patent Application No. 10 2009 055 437.8-33 dated Dec. 10, 2010.

* cited by examiner

*Primary Examiner* — Ha Tran T Nguyen
*Assistant Examiner* — Raj R Gupta
(74) *Attorney, Agent, or Firm* — Amerson Law Firm, PLLC (57) ABSTRACT

In sophisticated semiconductor devices comprising high-k metal gate electrode structures formed on the basis of a replacement gate approach, semiconductor-based resistors may be provided without contributing to undue process complexity in that the resistor region is recessed prior to depositing the semiconductor material of the gate electrode structure. Due to the difference in height level, a reliable protective dielectric material layer is preserved above the resistor structure upon exposing the semiconductor material of the gate electrode structure and removing the same on the basis of selective etch recipes. Consequently, well-established semiconductor materials, such as polysilicon, may be used for the resistive structures in complex semiconductor devices, substantially without affecting the overall process sequence for forming the sophisticated replacement gate electrode structures.

17 Claims, 6 Drawing Sheets

SEMICONDUCTOR RESISTORS FORMED AT A LOWER HEIGHT LEVEL IN A SEMICONDUCTOR DEVICE COMPRISING METAL GATES

BACKGROUND OF THE INVENTION

1. Field of the Invention

The present disclosure generally relates to the field of fabricating integrated circuits, and, more particularly, to resistors in complex integrated circuits that comprise metal gate electrode structures.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit elements in highly complex integrated circuits and substantially determine the overall performance of these devices, other components, such as capacitors and resistors, may be required, wherein the size of these passive circuit elements may also have to be adjusted with respect to the scaling of the transistor elements in order to not unduly consume valuable chip area. Moreover, the passive circuit elements, such as the resistors, may have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay. For example, in sophisticated applications, resistors may frequently be provided in the form of "integrated polysilicon" resistors which may be formed above isolation structures so as to obtain the desired resistance value within the predefined tolerances without significantly contributing to parasitic capacitance, as may be the case in "buried" resistive structures which may be formed within the active semiconductor layer. A typical polysilicon resistor may thus require the deposition of the basic polysilicon material, which may frequently be combined with the deposition of a polysilicon gate electrode material for the transistor elements. During the patterning of the gate electrode structures, the resistors may also be formed, the size of which may significantly depend on the basic specific resistance value of the polysilicon material and the type of dopant material and concentration that may be incorporated into the resistors so as to adjust the resistance values.

The continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, referred to as a channel region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on the dopant concentration of the drain and source regions, the mobility of the charge carriers and, for a given transistor width, on the distance between the source region and the drain region, which is also referred to as channel length.

Presently, most complex integrated circuits are based on silicon due to the substantially unlimited availability, the well-understood characteristics of silicon and related materials and processes and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called short channel behavior, according to which variability in channel length may have a significant influence on the resulting threshold voltage of the transistor. Aggressively scaled transistor devices with a relatively low supply voltage and, thus, a reduced threshold voltage, therefore, suffer from a significant increase of the leakage current caused by the reduced thickness of a silicon dioxide gate dielectric. For example, a channel length of approximately 0.08 µm may require a gate dielectric made of silicon dioxide as thin as approximately 1.2 nm in order to maintain the required capacitive coupling between the gate electrode and the channel region. Although high speed transistor elements having an extremely short channel may, in general, preferably be used in high speed signal paths, whereas transistor elements with a longer channel may be used for less critical signal paths, the relatively high leakage current caused by the direct tunneling of charge carriers through the ultra-thin silicon dioxide gate dielectric of the high speed transistor elements may reach values for an oxide thickness in the range of 1-2 nm that may no longer be compatible with thermal design power requirements for any type of complex integrated circuit system.

For this reason, replacing silicon dioxide as the base material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with gate dielectric material, the presence of a depletion zone may thus be avoided, while, at the same time, a moderately high conductivity may be achieved by also using a highly conductive metal, such as aluminum, as a further electrode material.

As is well known, the threshold voltage of the transistor may depend on the overall transistor configuration, on a complex lateral and vertical dopant profile of the drain and source regions, and the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, the high-k dielectric material may be formed in combination with an appropriate metal-containing cap layer, such as titanium nitride and the like, followed by the deposition of a polysilicon material, in combination with other materials, if required, which may then be patterned in order to form a gate electrode structure. Concurrently, corresponding resistors may be patterned, as described above. Thereafter, the basic transistor configuration may be completed by forming drain and source regions, performing anneal processes and finally embedding the transistors in a dielectric material. Thereafter, an appropriate etch sequence is performed, in which the top surfaces of the gate electrode structures, and all resistive structures, are exposed and the polysilicon material is removed. Subsequently, based on a respective masking regime, appropriate metal-containing electrode materials are filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors and P-channel transistors, respectively. Concurrently, the resistive structure also receives the metal-containing electrode material. Due to the enhanced conductivity of the metal-containing electrode material, however, the resistivity of the resistive structures also exhibits a significantly reduced value, thereby requiring a reduction of line widths of these structures and/or an increase of the total length of these structures. While the former measure may result in patterning problems, since extremely small line widths may be required, the latter aspect may result in an increased consumption of valuable chip area. For this reason, in some conventional approaches, the resistive structures may be formed in the active semiconductor material of SOI devices, instead of providing the resistive structures above the isolation structures, which, however, may result in reduced performance due to an increased parasitic capacitance of these resistive structures. Furthermore, it has been observed that a significant spread of the resistance values may occur upon forming the resistive structures in the active layer of SOI devices. Additionally, this concept may not be readily applied to bulk devices. In other approaches, the resistors have to rebuild in a very advanced manufacturing stage, which may significantly reduce the overall throughput.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which resistive structures or resistors may be formed on the basis of an appropriate semiconductor material, such as a polysilicon material, a silicon/germanium material and the like, while, at the same time, sophisticated high-k metal gate electrode structures may be provided on the basis of a replacement gate approach. To this end, the semiconductor material of the resistive structures may be reliably preserved upon replacing the semiconductor material of the replacement gate electrode structures by ensuring that, upon exposing the top surface of the semiconductor material in the gate electrode structures, an exposure of the semiconductor material in the resistive structure is reliably suppressed. For this purpose, in some illustrative aspects disclosed herein, an appropriate device topography may be provided such that the top surface of the semiconductor material in the resistive structure may be positioned at a height level that is less or lower than a height level of the top surface of the semiconductor material in the replacement gate electrode structure. Consequently, upon performing a material removal process, such as a polishing process, a certain amount of dielectric material may still be preserved above the semiconductor material in the resistive structure, while, on the other hand, the top surface of the semiconductor material of the gate electrode structure may be exposed and may subsequently be removed by an appropriate etch chemistry. In some illustrative aspects disclosed herein, the surface topography may be obtained by recessing a resistor region, such as an isolation structure, prior to depositing the semiconductor material, which may act as a placeholder material for gate electrode structures of sophisticated transistors, while in other less critical transistors, and in particular in resistive structures, the semiconductor material may act as the actual electrode material, which may extend to a lower height level due to the recessed configuration of the resistor region. In some illustrative embodiments, the recessing of the resistor region may be performed after the deposition of any conductive cap layer materials, which may be provided in some replacement gate approaches, thereby removing the conductive cap material in the resistive structure, and thus avoiding any negative influence of the conductive material on the overall electronic characteristics of the resistive structure. In other cases, the recessing may be performed immediately after completing the isolation structures, when replacement gate strategies are applied, in which the initial replacement gate electrode structure may not comprise a conductive electrode material.

Consequently, sophisticated replacement gate approaches may be efficiently applied in order to obtain sophisticated high-k metal gate electrode structures, while, at the same time, semiconductor-based resistive structures may be formed, thereby providing a superior electronic behavior of the resistive structure, for instance in view of a reduced spread of resistance values, superior capacitive behavior when formed on an isolation structure and the like. Moreover, well-established designs of resistive structures may be used in combination with sophisticated high-k metal gate electrode structures that are formed on the basis of a replacement gate approach.

One illustrative semiconductor device disclosed herein comprises a transistor comprising a gate electrode structure that is formed on an active region. The gate electrode structure comprises a high-k gate dielectric material and a metal-containing electrode material formed above the high-k gate dielectric material, wherein the gate electrode structure extends with its top surface to a first height level. The semiconductor device further comprises a resistor formed above a resistor region and comprising a semiconductor material, which extends with a top surface thereof to a second height level that is less than the first height level.

One illustrative method disclosed herein relates to forming a semiconductor device. The method comprises recessing a resistor region of the semiconductor device and forming a semiconductor layer above a transistor region and the recessed resistor region. The semiconductor layer extends to a first height level above the transistor region and extends to a second height level above the resistor region, wherein the second height level is less than the first height level. The method further comprises forming a gate electrode structure above the transistor region and a resistor above the recessed resistor region by patterning the semiconductor layer. Moreover, an insulating material is provided above and laterally adjacent to the gate electrode structure and the resistor. The method further comprises exposing a top surface of the semiconductor layer of the gate electrode structure without exposing the semiconductor layer of the resistor. Additionally, the method comprises removing the semiconductor layer of the gate electrode structure and forming a metal-containing electrode material in the gate electrode structure while preserving the semiconductor layer of the resistor.

A further illustrative method disclosed herein comprises forming a recess in an isolation structure that is formed in a semiconductor layer of a semiconductor device. The method further comprises forming a replacement gate electrode structure above an active semiconductor region and a resistive structure above the recess of the isolation structure, wherein the replacement gate electrode structure and the resistive structure comprise a semiconductor material. Moreover, the method comprises forming a transistor in and above the active region on the basis of the replacement gate electrode structure. Additionally, the method comprises removing the semiconductor material selectively from the replacement gate electrode structure while preserving the semiconductor material in the resistive structure. Additionally, the method comprises forming a metal-containing electrode material in the replacement gate electrode structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which sophisticated high-k metal gate electrode structures may be provided on the basis of replacement gate approaches, while concurrently other electrode structures, such as actual gate electrode structures and, in particular, resistive structures, may be formed on the basis of the placeholder semiconductor material of the initially provided replacement gate electrode structures, while the incorporation of any additional metal-containing highly conductive materials, such as titanium nitride and the like, may be avoided. The semiconductor material, such as polysilicon, a polysilicon/germanium mixture and the like, may be efficiently preserved in the resistive structures, and possibly in other gate electrode structures, by providing a specific device topography in which the semiconductor material may extend to a lower height level in the resistive structures compared to the replacement gate electrode structures. The desired device topography may be achieved by recessing a corresponding device region, which will also be referred to herein as a resistor region, prior to depositing the semiconductor material, which may be substantially of the same thickness and may thus extend to different height levels. For example, by selecting an appropriate difference in height level of, for instance, approximately 20 nm and more, a corresponding additional dielectric material may be formed above the resistive structures and may act as an efficient protective material upon exposing the top surface of the semiconductor material in the actual replacement gate electrode structures and during the subsequent removal thereof on the basis of selective etch chemistries. Consequently, the resistive structures may be formed on the basis of well-established material characteristics of, for instance, polysilicon material, without requiring extremely critical patterning strategies as may be required in conventional strategies, in which metal-based resistive structures have to be provided. Furthermore, an increased length dimension may also be avoided, since a desired specific resistivity of the semiconductor material may be adjusted so as to comply with the requirements of the semiconductor resistors.

Figure 1A:
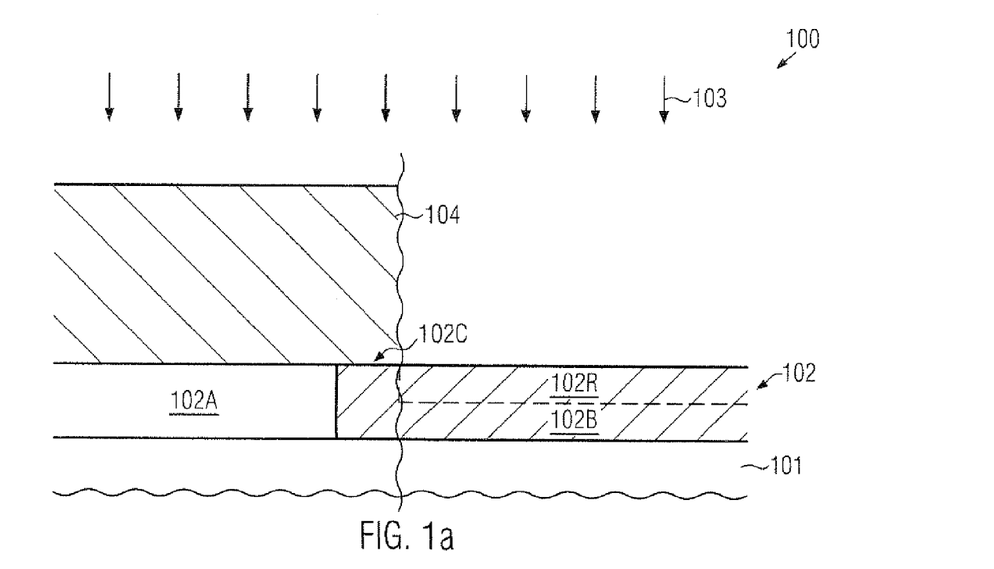
FIG. 1a schematically illustrates a cross-sectional view of a semiconductor device in an early manufacturing stage, in which a resistor region may be recessed after completing any isolation structures in a semiconductor layer, according to illustrative embodiments.

FIG. 1a schematically illustrates a cross-sectional view of a semiconductor device 100 comprising a substrate 101 and a device layer or semiconductor layer 102, which in combination may represent a silicon-on-insulator (SOI) configuration, a bulk configuration or a combination. For example, in an SOI configuration, a buried insulating layer (not shown) may be formed below and adjacent to the device layer 102, while, in a bulk configuration, the device layer 102 may be formed on a substantially crystalline material of the substrate 101. It should be appreciated that, in the manufacturing stage shown, the semiconductor layer 102 or device layer may actually be comprised of a plurality of semiconductor regions, such as an active region 102A, which are laterally separated by isolation structures 102C. Consequently, the semiconductor layer 102 may be comprised of semiconductor regions and isolation regions, one of which or a portion thereof may represent a resistor region 102B, which is to be understood as a device region above which a semiconductor-based resistive structure is to be formed. On the other hand, the active region 102A may also be referred to as a transistor region, since, in and above the region 102A, a transistor is to be formed on the basis of a metal gate electrode structure. It should be appreciated that, in FIG. 1a, the regions 102A, 102B are illustrated as being positioned laterally in close proximity to each other, while, in other cases, the resistor region 102B may be positioned at any appropriate location across the substrate 101, depending on the circuit layout of the semiconductor device 100.

Moreover, in the manufacturing stage shown in FIG. 1a, an etch mask 104, such as a resist material, a hard mask material, for instance in the form of silicon nitride and the like, may be provided above the device layer 102, such that the resistor region 102B may be exposed, while the active region 102A and a portion of the isolation structure 102C may be covered.

The semiconductor device 100 as illustrated in FIG. 1a may be formed on the basis of any appropriate process strategy. That is, the isolation structure 102C including the resistor region 102B may be formed by applying well-established lithography, etch, deposition and planarization techniques in order to form corresponding trenches in the initial semiconductor material of the layer 102 and refilling the trenches with an appropriate insulating material. Prior to or after forming the isolation structure 102C, any dopant species, such as well dopants and the like, may be incorporated into the various active semiconductor regions, such as the region 102A, in accordance with the requirements for any transistors to be formed in and above the active region 102A. Next, the etch mask 104 may be provided on the basis of any appropriate lithography technique, thereby defining the lateral position and lateral size of the resistor region 102B. Next, the device 100 may be exposed to a reactive etch ambient 103 in order to remove material of the resistor region 102B, thereby forming an appropriate recess 102R having a desired depth in order to obtain a desired device topography for the further processing of the device 100. The etch process 103 may be performed on the basis of any appropriate wet chemical etch recipe or plasma assisted etch process, wherein a plurality of etch recipes are available, for instance efficiently etching silicon dioxide material. It should be appreciated that the etch time of the process 103 may be efficiently controlled so as to obtain the desired depth of the recess 102R, while, in other cases, an etch stop material (not shown) may be incorporated into the isolation structure 102C, for instance in the form of a silicon nitride material and the like. A corresponding etch stop material may be efficiently implemented upon forming the isolation structures 102C, i.e., upon refilling a corresponding trench formed in the layer 102. After recessing the resistor region 102B, the processing may be continued by depositing a gate dielectric material and a placeholder semiconductor material, such as a silicon material, which may be removed in a later manufacturing stage, above the active region 102A, wherein any appropriate high-k dielectric material may also be provided in the later manufacturing stage in order to obtain sophisticated high-k metal gate electrode structures.

Figure 1B:
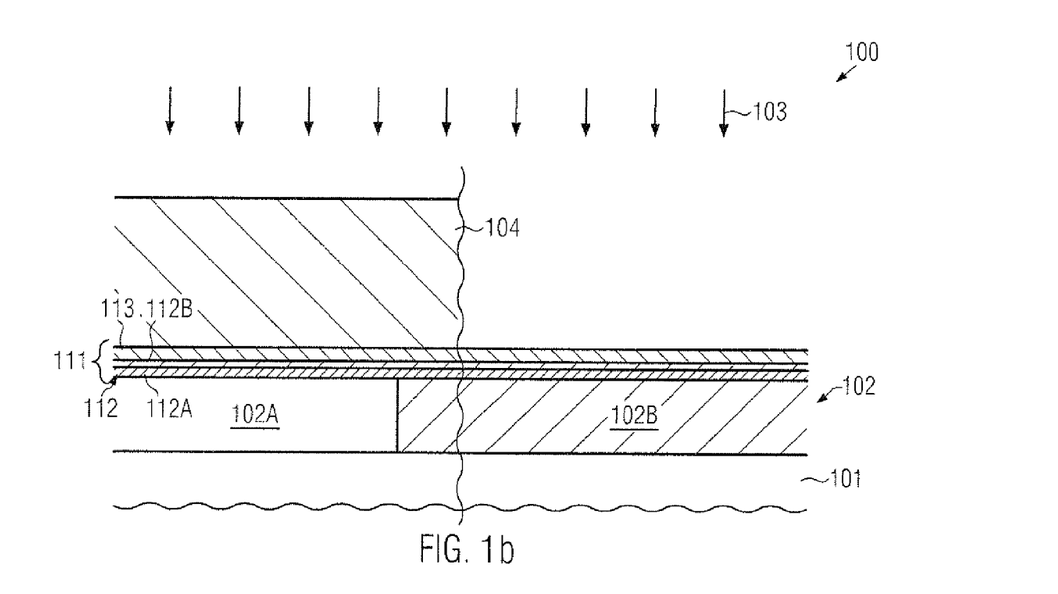
FIG. 1b schematically illustrates the semiconductor device according to further illustrative embodiments in which the recessing of a resistor region may be performed after providing a high-k dielectric material and a conductive cap material.

FIG. 1b schematically illustrates the semiconductor device 100 according to further illustrative embodiments in which a material layer stack 111 may be formed above the active region 102A and the resistor region 102B. The layer stack 111 may comprise a gate insulation layer 112, which may comprise any appropriate high-k dielectric material, followed by a metal-containing conductive cap material 113, for instance in the form of titanium nitride and the like. It should be appreciated that the gate insulation layer 112 may be provided in the form of any appropriate configuration, for instance in the form of two or more individual material layers 112A, 112B, such as a silicon dioxide-based material layer in combination with a high-k dielectric material. As previously discussed, frequently, the superior interface characteristics of silicon dioxide-based materials may be exploited, even in high-k dielectric material layers, by providing a very thin silicon dioxide-based material, for instance in the form of the layer 112A, followed by an actual high-k dielectric material, such as hafnium oxide and the like, which may provide a superior physical thickness of the gate insulation layer 112, while nevertheless preserving a high capacitive coupling, as discussed above. Since at least the material 112B may be sensitive with respect to exposure to certain process atmospheres, such as oxygen-based atmospheres and the like, the conductive material 113 may be provided so as to reliably protect the material 112B during the further processing and may also form a part of metal-containing electrode material. Consequently, the layer 113 may impart a moderately high conductivity to the layer stack 111, which, in some illustrative embodiments, may not be compatible with corresponding resistance values of resistive structures to be formed above the resistor region 102B. Consequently, the recessing of the resistor region 102B may be formed after providing the layer stack 111.

The layer stack 111 may be formed on the basis of any appropriate process strategies, for instance by forming the layer 112A, for example by oxidation and/or deposition, followed by the deposition of the high-k dielectric material 112B. Finally, the conductive cap material 113 may be formed on the basis of any appropriate deposition techniques. Thereafter, the etch mask 104 may be provided and an etch sequence 103 may be performed so as to etch through at least the material 113 and 112B and thereafter form the recess, which may be accomplished on the basis of any process strategies, as described above with reference to FIG. 1a. Consequently, during the etch sequence 103, any conductive materials of the layer stack 111 may be efficiently removed from above the resistor region 102B.

Figure 1C:
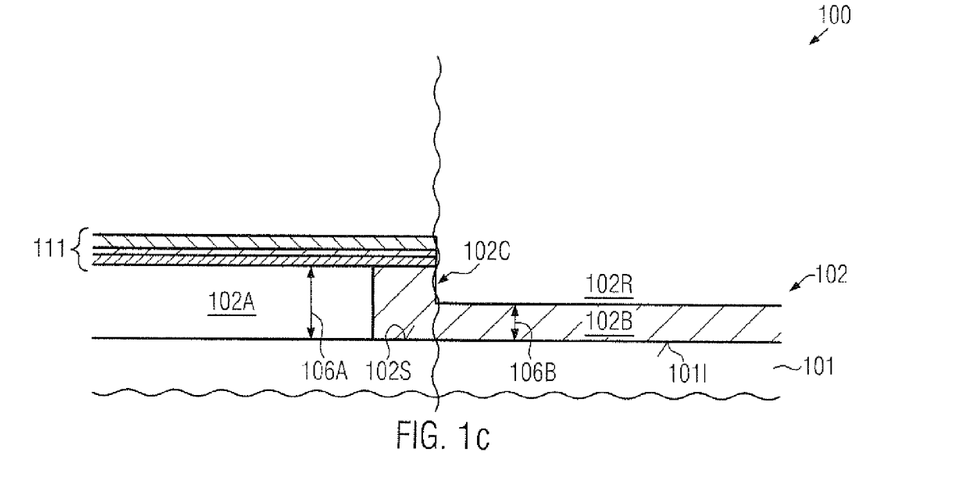
FIGS. 1c-1k schematically illustrate cross-sectional views of the semiconductor device during various manufacturing stages, in which a semiconductor-based resistive structure may be formed during a replacement gate approach by using the specific device topography obtained during the previous recessing of the resistor region, according to illustrative embodiments.

FIG. 1c schematically illustrates the semiconductor device 100 after completing the etch sequence 103 of FIG. 2b and after removing the etch mask 104 (FIG. 1b). Consequently, the recess 102R may be formed, thereby providing the resistor region 102B as a recessed region extending to a height level that is less than a height level of the active region 102A.

In this context, a height level is to be understood as a vertical distance of a specific surface of a material with respect to any appropriate reference plane. For example, an interface 101I formed by the device layer 102 and the substrate 101 may act as a reference plane. Similarly, an interface formed by a bottom surface 102S and the substrate 101 may act as a reference plane, for instance by considering a bulk configuration, in which the active semiconductor region 102A may extend into the crystalline material of the substrate 101. Thus, the recessed resistor region 102B may correspond to a height level 106B, which is less than a height level 106A of the active region 102A, wherein the difference of the height levels 106A, 106B may correspond to a depth of the recess 102R. For instance, the difference in height level may be selected to be approximately 20 nm and more depending on the overall device requirements and the process strategy applied for replacing a semiconductor material of a gate electrode structure in a later manufacturing stage.

Figure 1D:
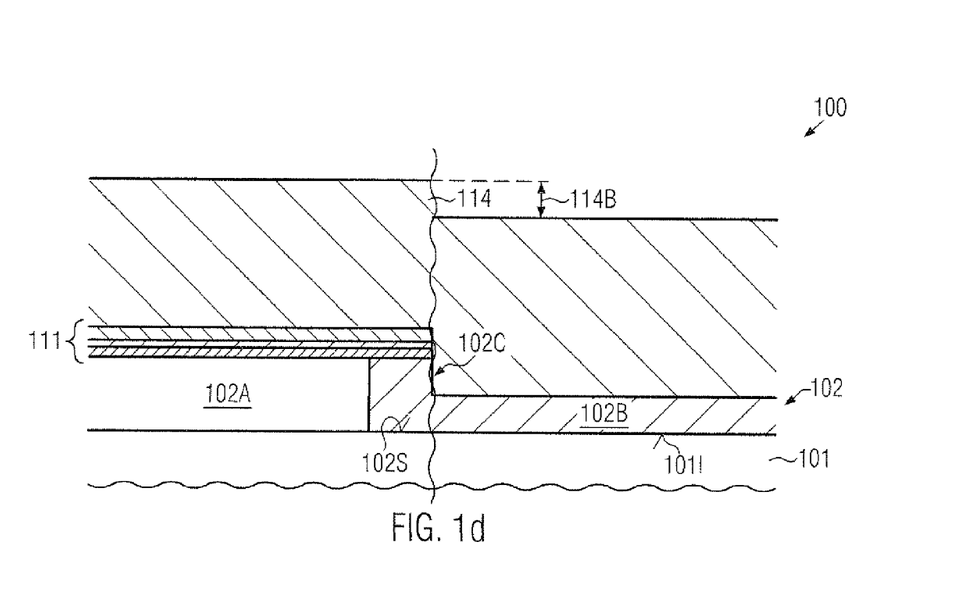

FIG. 1d schematically illustrates the semiconductor device 100 in a further advanced manufacturing stage, in which a semiconductor layer 114, such as a silicon layer, a silicon/germanium layer and the like, may be formed above the active region 102A and the resistor region 102B. The semiconductor layer 114 may be provided with any appropriate thickness so as to comply with the requirements in view of patterning and forming transistor elements, while the material composition may be selected so as to comply with the requirements of any resistive structures to be formed above the resistor region 102B. Due to the surface topography caused by the recess 102R (FIG. 1c), the semiconductor layer 114 may also extend to different height levels above the active region 102A and the region 102B, wherein a corresponding difference in height level, indicated by 114B, may substantially correspond to the difference of the height levels 106A and 106B (FIG. 1c) plus a thickness of the layer stack 111, if provided. In other cases, when the recess 102R may be formed prior to forming a gate dielectric material or a corresponding dielectric placeholder material (FIG. 1a), the corresponding dielectric material may be formed on the active region 102A and the recessed resistor region 102B, substantially without contributing to the height difference 114B.

The semiconductor layer 114 may be provided on the basis of any appropriate deposition technique, such as low pressure chemical vapor deposition (CVD) and the like, wherein a desired degree of dopant species may also be incorporated in order to adjust the specific resistivity of the material 114 in view of any resistive structures to be formed above the resistor region 102B. It should be appreciated that any further material layers, such as a dielectric cap material, hard mask materials and the like, may also be deposited after providing the semiconductor layer 114, depending on the overall process strategy. Moreover, upon performing a lithography process, a planarization material may be provided, if required, so as to obtain a substantially planar surface topography prior to actually patterning the semiconductor layer 114.

Figure 1E:
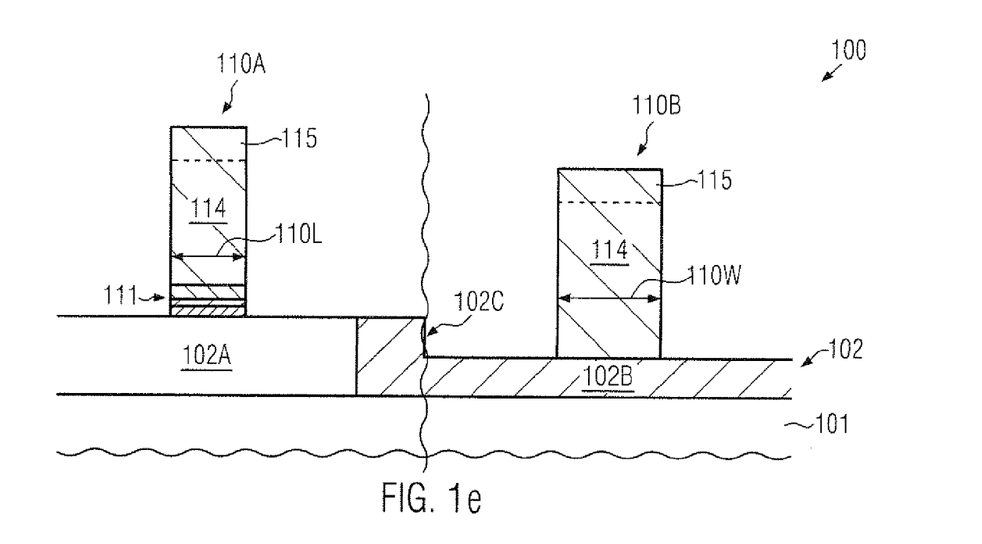

FIG. 1e schematically illustrates the semiconductor device 100 in a further advanced manufacturing stage. As illustrated, a gate electrode structure 110A, which may also be referred to as a placeholder gate electrode structure, may be formed on the active region 102A and may comprise the layer stack 111, the semiconductor layer 114, possibly in combination with one or more optional dielectric cap materials 115. Moreover, a length 110L of the gate electrode structure 110A may comply with the overall design rules and may be 40 nm and less in sophisticated applications. On the other hand, a resistor 110B may be formed on or above the resistor region 102B and may be comprised of the semiconductor layer 114, possibly in combination with one or more cap materials 115, while a width 110W may correspond to the desired resistor dimensions of a semiconductor-based resistive structure. It should be appreciated that a length of the resistor 110B may represent a dimension in a direction that is perpendicular to the drawing plane of FIG. 1e. Thus, a corresponding length and the width 110W may be selected such that a desired resistance may be obtained without unduly consuming valuable die area in the device 100. The structures 110A, 110B may be formed on the basis of any well-established process strategy, wherein the surface topography caused by the recessed resistor region 102B may not substantially negatively affect the patterning process, since, for instance, respective planarization materials may be used during the lithography process, while also, if desired, less critical lateral dimensions, such as the width 110W, may provide less critical patterning conditions of the resistive structure 110B compared to a gate length 110L of the structure 110A.

Figure 1F:
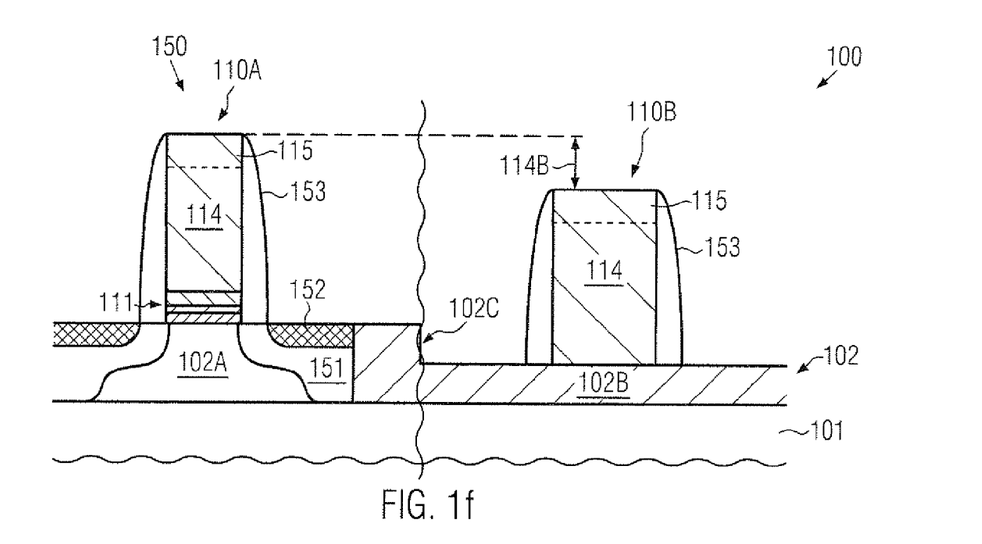

FIG. 1f schematically illustrates the semiconductor device 100 in a further advanced manufacturing stage. As shown, a transistor 150 may be formed in and above the active region 102A on the basis of the gate electrode structure 110A. The transistor 150 may comprise drain and source regions 151 having any appropriate lateral and vertical dopant profile in accordance with device requirements, wherein metal silicide regions 152 may also be formed within the drain and source regions 151. Additionally, a sidewall spacer structure 153 may be formed on the sidewalls of the gate electrode structure 110A. It should be appreciated that the optional dielectric cap material 115 may still be present, thereby avoiding the formation of a metal silicide in the semiconductor material 114. Similarly, the resistor 110B may comprise the optional material 115 in combination with the semiconductor material 114, which may have an appropriate dopant concentration incorporated therein so as to achieve the desired overall resistance value of the resistor 110B in combination with the overall geometry of the structure 110B. Moreover, the sidewall spacer structure 153 may also be formed on the sidewalls of the resistor 110B.

The semiconductor device 100 as illustrated in FIG. 1*f* may be formed on the basis of any appropriate process strategy. That is, appropriate implantation species may be incorporated into the active region 102A by using the gate electrode structure 110A as an implantation mask, wherein the spacer structure 153 may also be used to adjust the lateral profile of the drain and source regions 151. It should be appreciated that appropriate implantation strategies, in combination with masking regimes, may be well established and may be used for forming the drain and source regions 151. If required, the resistive structure 110B may be covered during corresponding implantation processes, when the initial resistivity of the material 114 may be considered appropriate for the resistor 110B. Next, any high temperature processes may be performed to activate the dopant species and re-crystallize implantation-induced damage. Thereafter, the metal silicide regions 152 may be formed by depositing any appropriate refractory metal and initiating a chemical reaction with underlying silicon material in accordance with any well-established process strategies. Consequently, the basic configuration of the transistor 150 and also the basic configuration of the resistive structure 110B may be completed, while the material 114 of the gate electrode structure 110A has still to be replaced by a desired highly conductive electrode material. To this end, a difference in height level 114B between the gate electrode structure 110A and the resistor 110B results in a desired selectivity between the gate electrode structure 110A and the resistor 110B, when selectively removing the material 114 in the gate electrode structure 110A.

Figure 1G:
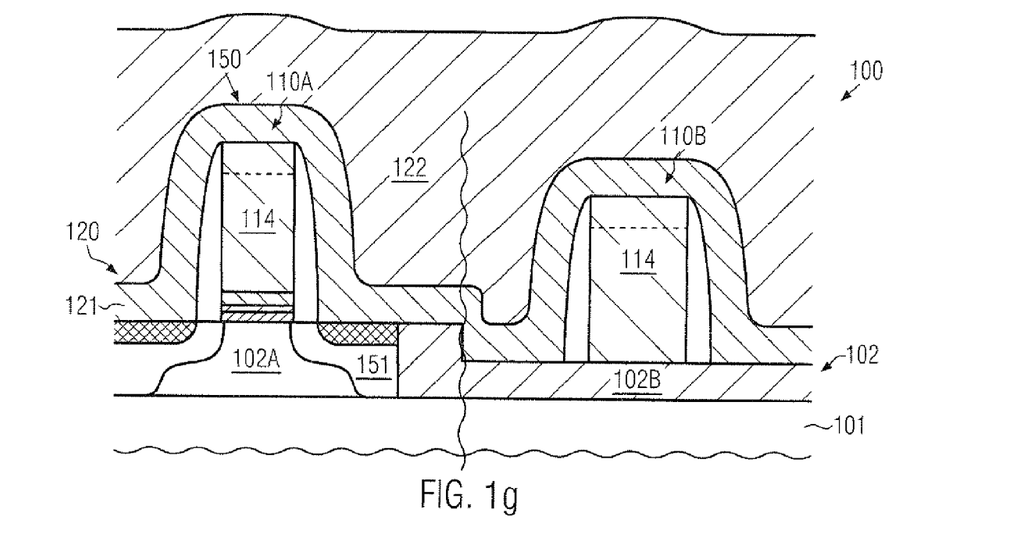

FIG. 1*g* schematically illustrates the device 100 in a further advanced manufacturing stage. As shown, a portion of an interlayer dielectric material 120 may be formed above and lateral adjacent to the transistor 150 and the resistor 110B. For example, the interlayer dielectric material 120 may comprise a first dielectric material 121, such as a silicon nitride material and the like, which may typically act as an etch stop material during the further processing, when patterning the interlayer dielectric material 120. Furthermore, a second material layer 122, such as a silicon dioxide layer and the like, may be provided so as to efficiently fill any spaces between the various circuit elements and also substantially reduce the difference in topography between the active region 102A, and the recessed resistor region 102B. For example, silicon dioxide may be deposited on the basis of CVD techniques having a superior gap fill behavior, thereby efficiently filling any spaces and also compensating for any differences in the general height level, except for a certain degree of surface topography caused by the gate electrode structure 110A and the resistor 110B. The resulting surface topography may be efficiently planarized by performing a polishing process, such as a chemical mechanical polishing (CMP) process using well-established process recipes. Upon planarizing the interlayer dielectric material 120 or in a separate polishing process, the material removal may be continued so as to finally expose the semiconductor material 114 in the gate electrode structure 110A. In other illustrative embodiments, after planarizing the interlayer dielectric material 120, any other appropriate material removal process, such as an etch process, possibly in combination with a polishing process, may be applied.

Figure 1H:
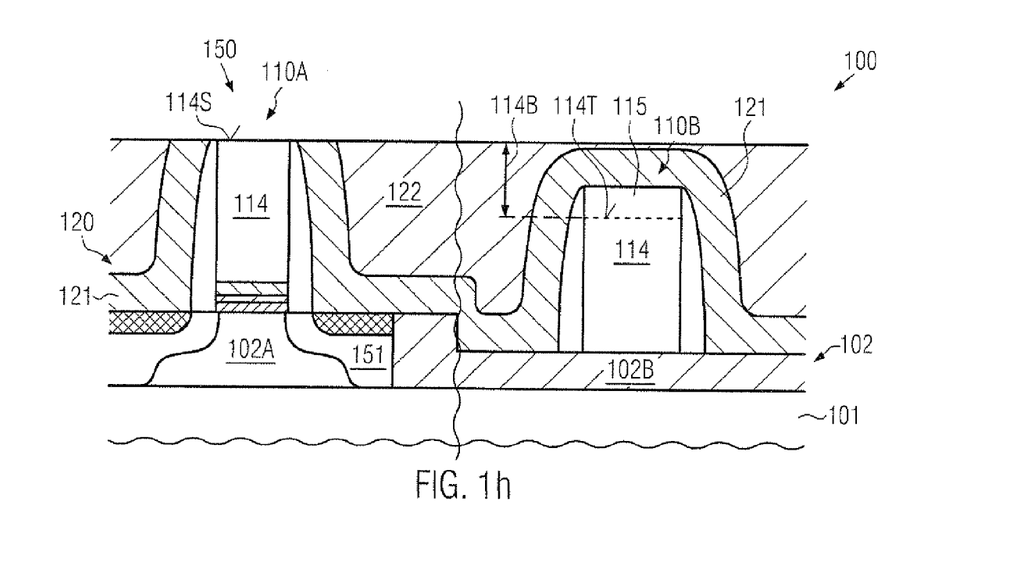

FIG. 1*h* schematically illustrates the semiconductor device 100 in a manufacturing stage in which a top surface 114S of the gate electrode structure 110A may be exposed, for instance, on the basis of a polishing process, as discussed above, while a corresponding surface 114T of the semiconductor material 114 in the resistor 110B may be reliably covered, for instance by at least the cap material 115, if provided, possibly in combination with the portion of the material 121 and possibly in combination with a portion of the material 122. That is, during the preceding material removal process, such as a polishing process, the difference in height level 114B of the surfaces 114S, 114T may ensure that the surface 114T remains reliably covered by one of the overlying dielectric materials.

Figure 1I:
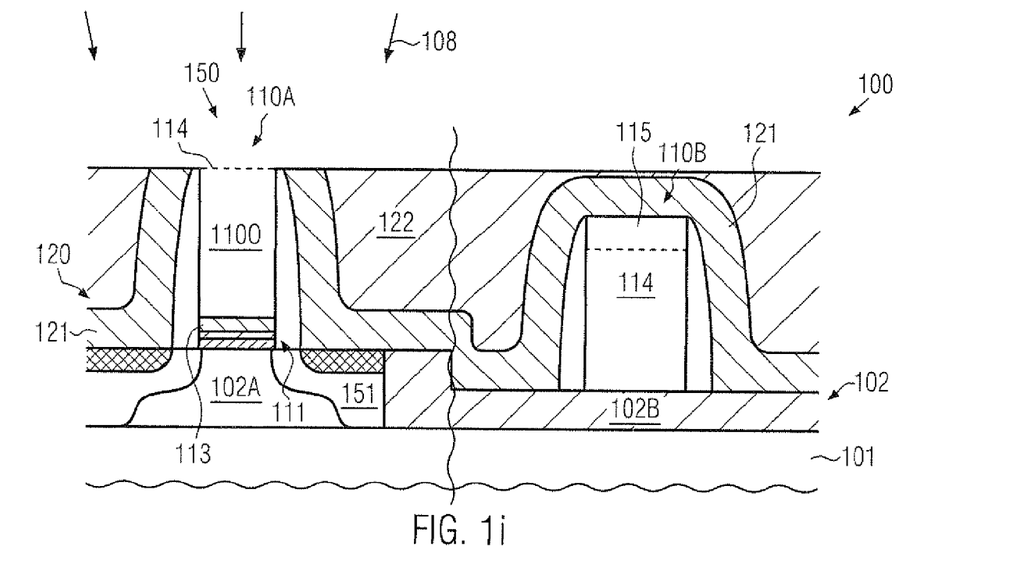

FIG. 1*i* schematically illustrates the semiconductor device 100 when exposed to a selective etch process 108 in order to selectively remove the semiconductor material 114 in the gate electrode structure 110A, thereby forming a gate opening 110O. On the other hand, the material 114 in the resistor 110B may be reliably protected by one or more of the materials 115, 121 and 122. It should be appreciated that the etch process 108 may be performed on the basis of any appropriate etch chemistries, such as wet chemical etch chemistries and the like, wherein the layer stack 111, such as the conductive cap layer 113, may act as an efficient etch stop material. If required, one or more material layers of the stack 111 may also be removed and may be replaced with any appropriate material. For example, as discussed earlier, in some approaches, the conductive cap material 113 may not be provided in the layer stack 111 when not comprising a high-k dielectric material in this manufacturing stage. Consequently, any other appropriate dielectric material, such as silicon dioxide and the like, may be used as an efficient etch stop material upon removing the material 114 and, thereafter, a high-k dielectric material may be formed in the opening 110O on the basis of well-established deposition techniques. In other cases, appropriate work function metal species, such as lanthanum, aluminum and the like, may be incorporated in the opening 110O, for instance by depositing appropriate material layers, possibly in combination with conductive etch stop materials and the like, as may be required for providing appropriate work function metals for the gate electrode structures of N-channel transistors and P-channel transistors. Irrespective of the patterning sequence applied, the semiconductor material 114 of the resistor 110B may be reliably protected so that the resistance value determined by the overall geometry of the resistor 110B and the material composition of the material 114 may be preserved.

Figure 1J:
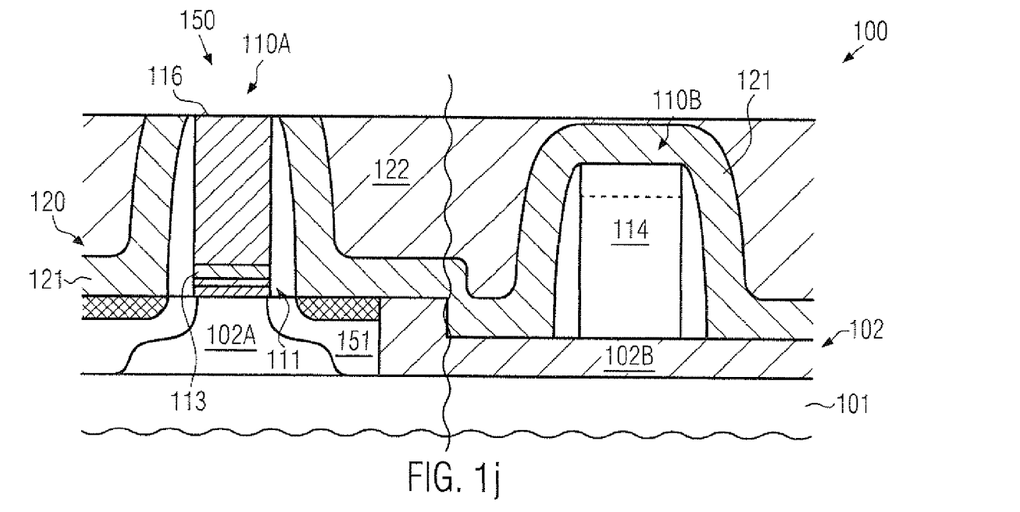

FIG. 1*j* schematically illustrates the semiconductor device 100 in a further advanced manufacturing stage in which a metal-containing electrode material 116, such as aluminum and the like, possibly in combination with an appropriate work function metal species, may be provided in the gate electrode structure 110A. To this end, appropriate deposition and patterning strategies may be applied, as discussed above, and thereafter any excess material may be removed, for instance, by polishing, etching and the like, while the semiconductor material 114 of the resistor 110B may be reliably protected. Thereafter, the processing may be continued by depositing a further portion of the interlayer dielectric material 120, for instance in the form of a silicon dioxide material and the like, and patterning the same so as to form contact openings that connect to the transistor 150 and the resistor 110B in accordance with the overall circuit layout of the device 100.

Figure 1K:
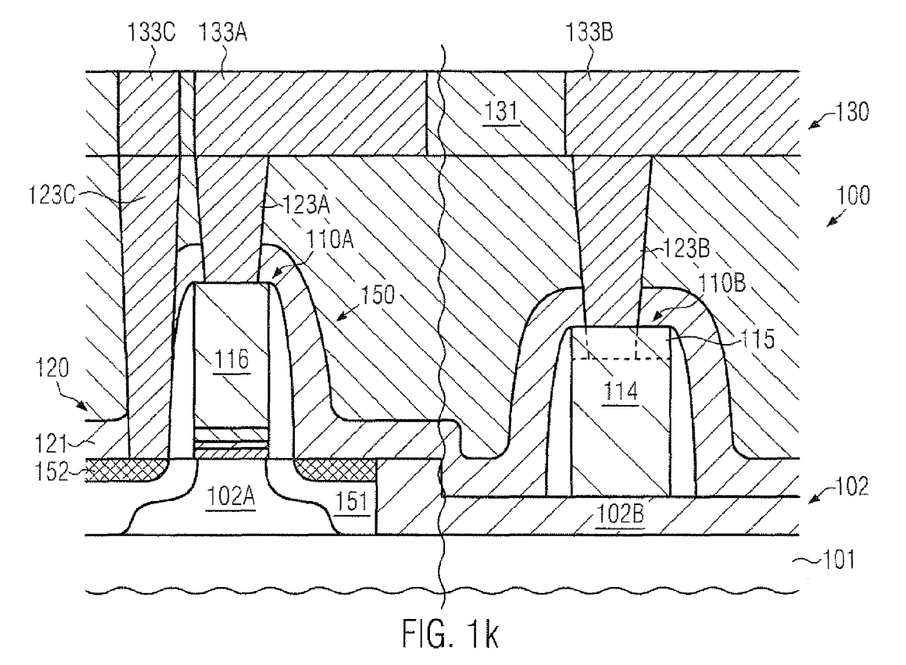

FIG. 1k schematically illustrates the semiconductor device 100 in a further advanced manufacturing stage. As illustrated, contact elements 123A, 123B, 123C may be formed in the interlayer dielectric material 120 so as to connect to the transistor 150 and the resistor 110B. As discussed above, the interlayer dielectric material 120 may now have an appropriate thickness so as to act as an interface between the circuit elements in and above the device level 102, i.e., the transistor 150 and the resistor 110B, and a metallization system 130. For convenience, a very first metallization layer of the metallization system 130 may be illustrated in FIG. 1k, wherein it should be understood that, typically, a plurality of stacked metallization layers may be implemented in order to comply with the overall circuit layout of the device 100. In the embodiment shown, the contact element 123A may extend through the interlayer dielectric material 120 and may connect to the gate electrode structure 110A, i.e., the conductive material 116. Similarly, the contact element 123C may also connect to the transistor 150, for instance to one of the drain and source regions 151, i.e., a corresponding metal silicide region 152. On the other hand, the contact element 123B may connect to the resistor 110B, i.e., the semiconductor material 114. For instance, if the optional dielectric cap material 115 is provided, the contact element 123B may extend through the material 115 so as to connect to the semiconductor material 114. On the other hand, the contact elements 123A, 123B, 123C may connect to the metallization system 130, i.e., to corresponding metal regions 133A, 133B, 133C, which may be formed in an appropriate dielectric material 131 of the metallization layer 130.

The contact elements 123A, 123B, 123C may be formed by patterning the interlayer dielectric material 120, which may be accomplished on the basis of any patterning strategies, for instance using hard mask materials and the like. During the etch sequence, the material 121 may be used as an efficient etch stop material, thereby reliably forming the contact openings of significantly different depth, such as contact openings for the contact elements 123A, 123B on the one hand, and the contact element 123C on the other hand. Thereafter, a further etch step may be applied to etch through the layer 121, thereby also etching through the dielectric cap layer 115 if provided in the resistor 110B. Next, any appropriate conductive material, such as tungsten and the like, possibly in combination with additional barrier materials, may be filled into the contact openings and excess material may be removed, thereby obtaining the electrically insulated contact elements 123A, 123B, 123C. Thereafter, the metallization layer 130 may be formed in accordance with any appropriate process strategy.

As a result, the present disclosure provides semiconductor devices and manufacturing techniques in which semiconductor-based resistive structures, such as polysilicon resistors, may be formed during a replacement gate approach, wherein a difference in height level between the gate electrode structures and the resistive structures may result in a reliable confinement of the semiconductor material in the resistive structures. The difference in height level may be efficiently adjusted by forming a recess prior to depositing the semiconductor material, wherein the depth of the recess may substantially determine the resulting difference in height level. An appropriate difference in height level may be selected by taking into consideration the further processing, for instance the overall strategy for exposing the semiconductor material in the replacement gate electrode structures, while, on the other hand, the difference in surface topography may not unduly affect any other processes and, thus, characteristics of circuit elements, such as the replacement gate structures. It should be appreciated that a recessing of certain device areas may also be applied to a semiconductor region, in which transistors may be formed on the basis of semiconductor-based gate electrode structures, as long as the degree of recessing is compatible with the overall transistor characteristics. For instance, in a bulk configuration, the removal of semiconductor material of the corresponding active transistor regions may be less critical.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    forming a recess in a resistor region of said semiconductor device;
    after forming said recessed resistor region, forming a high-k gate insulation layer and a metal-containing cap material above a transistor region of said semiconductor device and above said recessed resistor region;
    forming a semiconductor layer above said transistor region and said recessed resistor region, said semiconductor layer extending to a first height level above said transistor region and extending to a second height level above said recessed resistor region, said second height level being less than said first height level;
    forming a gate electrode structure above said transistor region and a resistive structure above said recessed resistor region by patterning said semiconductor layer;
    providing an insulating material above and laterally adjacent to said gate electrode structure and said resistive structure;
    exposing a top surface of said semiconductor layer of said gate electrode structure without exposing said semiconductor layer of said resistive structure; and
    removing said semiconductor layer of said gate electrode structure to thereby form a gate opening and forming a metal-containing electrode material in said gate opening while preserving said semiconductor layer of said resistive structure.

2. The method of claim 1, further comprising forming a high-k dielectric material in said gate opening after removing said semiconductor layer of said gate electrode structure.

3. The method of claim 1, wherein exposing a top surface of said semiconductor layer of said gate electrode structure comprises performing a polishing process.

4. The method of claim 1, wherein forming said semiconductor layer comprises depositing at least one of silicon and germanium.

5. The method of claim 1, further comprising forming a dielectric cap layer above said semiconductor layer and patterning said dielectric cap layer with said semiconductor layer so that each of said gate electrode structure and said resistive structure further comprise said dielectric cap layer, wherein exposing said top surface of said semiconductor layer of said gate electrode structure comprises removing said dielectric cap layer from said gate electrode structure and wherein removing said semiconductor layer of said gate electrode structure comprises preserving said dielectric cap layer above said semiconductor layer of said resistive structure.

6. The method of claim 1, wherein forming said recess in said resistor region comprises forming an etch mask above said transistor region and exposing said resistor region and performing an etch process so as to remove material of said resistor region.

7. The method of claim 6, further comprising forming said resistor region by forming an isolation structure in a device layer of said semiconductor device, wherein said device layer comprises said transistor region.

8. A method, comprising:
   forming a recess in an isolation structure formed in a semiconductor layer of a semiconductor device;
   after forming said recess in said isolation structure, forming a high-k gate insulation layer and a metal-containing cap material above an active semiconductor region and above said recess in said isolation structure;
   forming a placeholder gate electrode structure above said active semiconductor region and a resistive structure above said recess in said isolation structure, each of said placeholder gate electrode structure and said resistive structure comprising a semiconductor material;
   removing said semiconductor material selectively from said placeholder gate electrode structure to thereby form a gate opening while preserving said semiconductor material in said resistive structure; and
   forming a replacement gate electrode structure comprised of a metal-containing electrode material in said gate opening.

9. The method of claim 8, wherein forming said replacement gate electrode structure comprises forming a high-k dielectric material in said gate opening after removing said semiconductor material selectively in said placeholder gate electrode structure.

10. The method of claim 8, wherein removing said semiconductor material selectively in said placeholder gate electrode structure comprises forming a dielectric material above and laterally adjacent to said placeholder gate electrode structure and said resistive structure and performing a polishing process so as to expose a top surface of said semiconductor material in said placeholder gate electrode structure.

11. The method of claim 8, wherein each of said placeholder gate electrode structure and said resistive structure further comprise a dielectric cap layer positioned above said semiconductor material, the method further comprising removing said dielectric cap layer selectively from above said semiconductor material of said placeholder gate electrode structure and removing said semiconductor material selectively from said placeholder gate electrode structure while preserving said dielectric cap layer above said semiconductor material of said resistive structure.

12. A method of forming a semiconductor device, the method comprising:
   forming a recess in a resistor region of said semiconductor device;
   after forming said recess, forming a high-k gate insulation layer and a metal-containing cap material above a transistor region and said recessed resistor region;
   forming a semiconductor layer above said transistor region and said recessed resistor region, said semiconductor layer extending to a first height level above said transistor region and extending to a second height level above said recessed resistor region, said second height level being less than said first height level;
   forming a dielectric cap layer above said semiconductor layer;
   forming a placeholder gate electrode structure above said transistor region and a resistor above said recessed resistor region by patterning said dielectric cap layer and said semiconductor layer;
   forming an insulating material above and laterally adjacent to said placeholder gate electrode structure and said resistor;
   exposing a top surface of said dielectric cap layer of said placeholder gate electrode structure without exposing said dielectric cap layer of said resistor;
   removing said dielectric cap layer and semiconductor layer of said placeholder gate electrode structure to thereby form a gate opening while preserving said dielectric cap layer and semiconductor layer of said resistor; and
   forming replacement gate structure comprised of a metal-containing electrode material in said gate opening.

13. The method of claim 12, further comprising forming a high-k dielectric material in said gate opening after removing said semiconductor layer of said placeholder electrode structure.

14. The method of claim 12, wherein exposing a top surface of said dielectric cap layer of said placeholder gate electrode structure comprises performing a polishing process.

15. The method of claim 12, wherein forming said semiconductor layer comprises depositing at least one of silicon and germanium.

16. The method of claim 12, wherein forming said recess in said resistor region comprises forming an etch mask above said transistor region and exposing said resistor region and performing an etch process so as to remove material of said resistor region.

17. The method of claim 16, further comprising forming said resistor region by forming an isolation structure in a device layer of said semiconductor device, wherein said device layer comprises said transistor region.

* * * * *